(12) United States Patent
Boyle

(10) Patent No.: US 6,832,041 B1
(45) Date of Patent: Dec. 14, 2004

(54) VIDEO RECORDING SYSTEM UTILIZING HOST-PROCESSOR-RESIDENT ERROR RECOVERY TO TRANSFER NON-TIME-CRITICAL, ERROR-INTOLERANT DATA SEGMENTS WHILE TRANSFERRING TIME-CRITICAL, ERROR-TOLERANT STREAMING DATA SEGMENTS AT A REQUIRED DATA TRANSFER RATE

(75) Inventor: William B. Boyle, Lake Forest, CA (US)

(73) Assignees: Keen Personal Media, Inc., Lake Forest, CA (US); Keen Personal Technologies, Inc., Lake Forest, CA (US)

( * ) Notice: Subject to any disclaimer, the term of this patent is extended or adjusted under 35 U.S.C. 154(b) by 884 days.

(21) Appl. No.: 09/628,583

(22) Filed: Jul. 31, 2000

(51) Int. Cl.[7] ............................. H04N 5/85; H04N 7/64
(52) U.S. Cl. ...................... 386/125; 386/113; 386/114
(58) Field of Search .............................. 386/125, 124, 386/126, 109, 111, 112, 27, 33, 113, 114, 115, 116, 2, 21, 22, 40, 46–47, 105; H04N 5/85, 7/64

(56) References Cited

U.S. PATENT DOCUMENTS

| 5,140,437 A | | 8/1992 | Yonemitsu et al. |
| 5,377,051 A | | 12/1994 | Lane et al. |
| 5,623,355 A | * | 4/1997 | Olsen ........................ 398/162 |
| 6,324,338 B1 | * | 11/2001 | Wood et al. .................. 386/83 |

* cited by examiner

Primary Examiner—Robert Chevalier
(74) Attorney, Agent, or Firm—Milad G. Shara, Esq.; Knobbe Martens Olson & Bear

(57) ABSTRACT

The present invention may be regarded as a video recording system and method of transferring a non-time-critical, error-intolerant data segment stored or to be stored on a disk drive, which is responsive to a set of data transfer commands generated by a host processor and which is operating in a mode optimized for transferring time-critical, error-tolerant streaming data segments stored or to be stored on the disk drive. The method includes sending a sequence of data transfer commands generated by the host processor to the disk drive to transfer a respective sequence of time-critical, error-tolerant streaming data segments at a required data transfer rate. The method further includes selectively interposing a first data transfer command into the sequence of data transfer commands, the first data transfer command initiating a first transfer of the non-time-critical, error-intolerant data segment. The method further includes transmitting a data transfer error signal generated by the disk drive to the host processor, the data transfer error signal having a state that indicates whether any data transfer errors have occurred with respect to the first transfer of the non-time-critical, error-intolerant data segment. The method further includes selectively initiating host-processor-resident error recovery in response to the state of the data transfer error signal to achieve an accuracy required for the non-time-critical, error-intolerant data segment while maintaining the required data transfer rate of the sequence of time-critical, error-tolerant data segments.

15 Claims, 7 Drawing Sheets

VIDEO RECORDING SYSTEM UTILIZING HOST-PROCESSOR-RESIDENT ERROR RECOVERY TO TRANSFER NON-TIME-CRITICAL, ERROR-INTOLERANT DATA SEGMENTS WHILE TRANSFERRING TIME-CRITICAL, ERROR-TOLERANT STREAMING DATA SEGMENTS AT A REQUIRED DATA TRANSFER RATE

BACKGROUND OF THE INVENTION

1. Field of the Invention

The present invention relates to information storage and display systems utilizing disk drives, and more particularly, to video recording systems that transfer both time-critical, error-tolerant streaming video data segments and non-time-critical, error-intolerant data segments.

2. Description of the Related Art

Hard disk drives using ATA (Advanced Technology Attachment) data transfer command sets are commonly used in non-audiovisual, computer-related applications which require a high level of accuracy for the data segments transferred between the disk drive and other system components. These non-audiovisual data segments are typically referred to as "information technology" or "IT" data segments. When a host processor sends a data transfer command to the disk drive to transfer an IT data segment, the host processor requires a high level of accuracy for the IT data segment, i.e., that the IT data segment be substantially free of errors. To ensure the required level of accuracy for IT data segments written to the disk drive or transmitted to the other system components, ATA read and write data transfer commands to the disk drive typically require some disk-drive-resident error recovery, in which the disk drive undertakes various error recovery procedures in an attempt to transfer the IT data segment with no data transfer errors. These disk-drive-resident error recovery procedures can include detection, identification, and correction procedures.

For example, these disk-drive-resident error recovery may include multiple retries, or other 'heroic' efforts to ensure that the requested IT data segments have the required level accuracy. Depending on the success of the various retries or other efforts, the disk-drive-resident error recovery may require additional time by the disk drive, thereby possibly delaying the transfer of other data segments. Despite these possible delays, it is generally acceptable in non-audiovisual applications to carry out the disk-drive-resident error recovery to ensure the accuracy of the IT data segments being written or transmitted. Therefore, the IT data segments can be described as non-time-critical, error-intolerant data segments because their transfers may be delayed without sacrificing system performance, but their transfers must not create errors which would lower the level of accuracy of the data segments.

Audiovisual applications for audiovisual or "AV" data segments corresponding to a video data stream have different requirements than do non-audiovisual applications. Audiovisual applications place more importance on the predictability of AV data transfer, while tolerating some loss in AV data accuracy. By their nature, AV data segments must be continually transferred at a required data transfer rate. The required data transfer rate for a video data stream is typically less than the maximum possible data transfer rate for the disk drive, resulting in additional bandwidth available for the concurrent transfer of additional data segments, some of which correspond to other video data streams. Even a small delay in the transfer of an AV data segment can deleteriously affect the system performance and can be quite noticeable to the user. However, because each AV data segment is quickly replaced by the next AV data segment, an error in a particular AV data segment would be nearly undetectable by the user. Thus, AV data segments can be described as time-critical, error-tolerant data segments because their transfers must not be delayed, but their transfers may create errors which would lower the level of accuracy of the data segments.

Audiovisual applications are therefore enhanced by modifications to the standard ATA data transfer command set for hard disk drive usage. One of these modifications has been the introduction of data transfer command sets optimized for audiovisual applications. For example, a document identified as "T13/D99128 revision 0" entitled "Proposal for Audio/Visual Feature Set" available from Western Digital Corporation of Irvine, Calif., and a document identified as "T13D99123 revision 1" entitled "Proposal for Streaming AV Commands" available from Seagate Technology of Longmont, Colo., both of which are incorporated by reference herein, propose alternative data transfer command sets for the storage on hard disk drives of streaming AV data and non-streaming IT data. These data transfer command sets add new instructions to the standard ATA data transfer command set to guarantee the timely transfer of AV data segments at the possible expense of the accuracy of the AV data segments.

As described in the above-referenced "Proposal for Audio/Visual Feature Set" from Western Digital Corporation, the "Streamweaver" data transfer command set incorporates additional data transfer commands into the standard ATA data transfer command set. These additional data transfer commands enable the host processor to alter the disk drive parameters and functions related to AV data transfer by toggling the disk drive between an AV mode and an IT mode. In the AV mode, the disk drive may reconfigure resources to support the streaming requirement of the AV data segments, and may set an upper limit on the total time devoted to error recovery in the event of a data transfer error, thereby constraining any disk-drive-resident error recovery. Similarly, in the IT mode, the disk drive may reconfigure resources to support the accuracy requirement of the IT data segments. In addition, the "Streamweaver" data transfer command set includes a "Read AV Stream" command and a "Write AV Stream" command which require fewer disk-drive-resident error recovery procedures in the event of a data transfer error than are required by the corresponding read and write commands of the standard ATA data transfer command set. Having fewer disk-drive-resident error recovery procedures is an effort to minimize the possibility of delaying the transfer of other AV data segments.

When being used in a video recording system, such as a digital video recorder, a disk drive is typically required to transfer streaming AV data segments concurrently with IT data segments corresponding to information such as an electronic program guide. In such a system, it is desirable that the disk drive transfer the IT data segments with the required high accuracy in response to data transfer commands by the host processor, while maintaining the required data transfer rate for the streaming AV data segments. Because the required data transfer rate for a video data stream is typically less than the maximum possible data transfer rate, there is usually sufficient bandwidth remaining to transfer both the streaming AV data segments and the IT data segments. However, due to the disk-drive-resident error recovery inherent in the standard read and write commands of the ATA data transfer command set, use of the standard read and write commands of the ATA command set for transferring the IT data segments may potentially exceed the available time, thereby interrupting or delaying the streaming AV data segments.

SUMMARY OF THE INVENTION

The present invention may be regarded as a method of transferring a non-time-critical, error-intolerant data segment stored or to be stored on a disk drive, which is responsive to a set of data transfer commands generated by: a host processor and which is operating in a mode optimized for transferring time-critical, error-tolerant streaming data segments stored or to be stored on the disk drive. The method comprises sending a sequence of data transfer commands generated by the host processor to the disk drive to transfer a respective sequence of time-critical, error-tolerant streaming data segments at a required data transfer rate. The method further comprises selectively interposing a first data transfer command into the sequence of data transfer commands, the first data transfer command initiating a first transfer of the non-time-critical, error-intolerant data segment. The method further comprises transmitting a data transfer error signal generated by the disk drive to the host processor, the data transfer error signal having a state that indicates whether any data transfer errors have occurred with respect to the first transfer of the non-time-critical, error-intolerant data segment. The method further comprises selectively initiating host-processor-resident error recovery in response to the state of the data transfer error signal to achieve an accuracy required for the non-time-critical, error-intolerant data segment while maintaining the required data transfer rate of the sequence of time-critical, error-tolerant data segments.

The present invention may also be regarded as a method of transferring a non-time-critical, error-intolerant data segment stored or to be stored on a disk drive, which is responsive to a set of data transfer commands generated by a host processor and which is operating in a mode optimized for transferring time-critical, error-tolerant streaming data segments stored or to be stored on the disk drive. The method comprises sending a sequence of data transfer commands generated by the host processor to the disk drive to transfer a respective sequence of time-critical, error-tolerant streaming data segments within a data transfer bandwidth less than a maximum bandwidth for the disk drive. The method further comprises selectively interposing a first data transfer command into the sequence of data transfer commands, the first data transfer command initiating a first transfer of the non-time-critical, error-intolerant data segment, the first transfer of the non-time-critical, error-intolerant data segment occurring within a remaining bandwidth that is a difference between the maximum bandwidth and the data transfer bandwidth. The method further comprises transmitting a data transfer error signal generated by the disk drive to the host processor, the data transfer error signal having a state that indicates whether any data transfer errors have occurred with respect to the first transfer of the non-time-critical, error-intolerant data segment. The method further comprises selectively initiating host-processor-resident error recovery in response to the state of the data transfer error signal to achieve an accuracy required for the non-time-critical, error-intolerant data segment while maintaining the data transfer bandwidth for the sequence of time-critical, error-tolerant data segments.

The present invention may also be regarded as a video recording system to record and playback non-time-critical, error-intolerant data segments and time-critical, error-tolerant streaming data segments using a disk drive responsive to a set of data transfer commands and optimized for transferring time-critical, error-tolerant streaming data segments at a required data transfer rate. The video recording system comprises a user interface that receives user input, and a video input interface that receives an external video data stream for a selected video program segment and that generates time-critical, error-tolerant streaming data segments. The video recording system further comprises a video output interface that is connectable to a display device, and a data management system. The data management system comprises at least one data buffer that receives, stores, and transmits time-critical, error-tolerant streaming data segments. The data management system further comprises a host processor that generates a sequence of data transfer commands sent to the disk drive to transfer a respective sequence of time-critical, error-tolerant streaming data segments at the required data transfer rate. The host processor also selectively interposes a first data transfer command into the sequence of data transfer commands, the first data transfer command initiating a first transfer of a non-time-critical, error-intolerant data segment. The host processor also receives a data transfer error signal generated by the disk drive, the data transfer error signal having a state that indicates whether any data transfer errors have occurred in the first transfer of the non-time-critical, error-intolerant data segment. The host processor also selectively initiates host-processor-resident error recovery in response to the state of the data transfer error signal to achieve an accuracy required for the non-time-critical, error-intolerant data segment while maintaining the required data transfer rate of the sequence of time-critical, error-tolerant streaming data segments.

DETAILED DESCRIPTION OF THE PREFERRED EMBODIMENT

Figure 1:
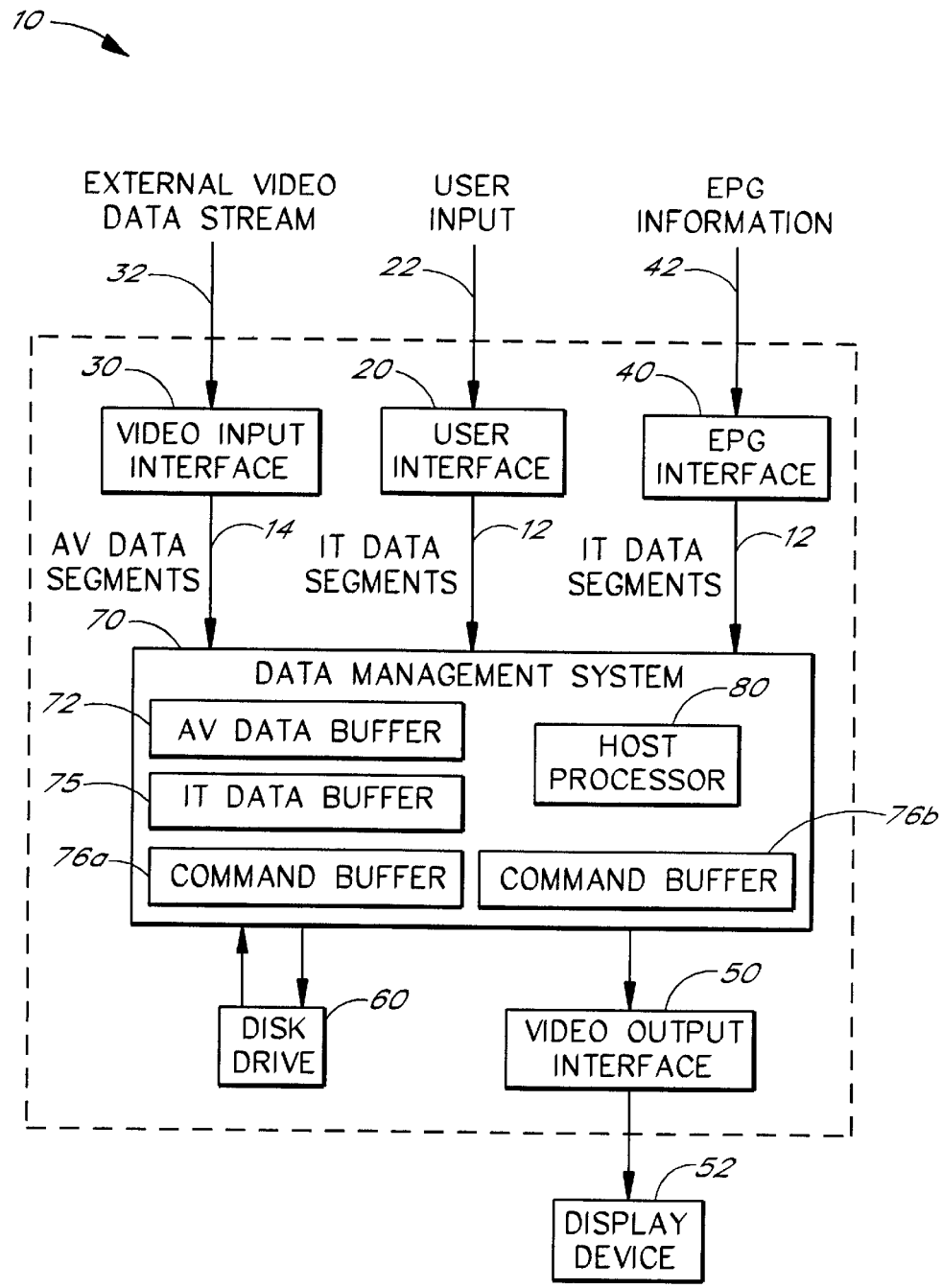
FIG. 1 schematically illustrates a video recording system in accordance with an embodiment of the present invention to record and playback non-time-critical, error-intolerant data segments and time-critical, error-tolerant streaming data segments.

FIG. 1 schematically illustrates a video recording system 10 in accordance with an embodiment of the present invention to record and playback non-time-critical, error-intolerant data segments ("IT data segments") 12 and time-critical, error-tolerant streaming data segments ("streaming AV data segments") 14. The video recording system 10 comprises a user interface 20 that receives user input 22 and that generates IT data segments 12, a video input interface 30 that receives an external video data stream 32 for a selected video program segment and that generates a sequence of streaming AV data segments 14, an electronic program guide ("EPG") interface 40 that receives EPG information 42 and that generates IT data segments 12, a video output interface 50 that is connectable to a display device 52, a disk drive 60, and a data management system 70. The disk drive 60 is responsive to a set of data transfer commands and is optimized for transferring streaming AV data segments 14 at a required data transfer rate.

The data management system 70 of the preferred embodiment of the present invention comprises at least one AV data buffer 72 that receives, stores, and transmits streaming AV data segments 14. In the preferred embodiment, the data management system 70 further comprises at least one IT data buffer 75 that receives, stores, and transmits IT data segments 12, and a plurality of command buffers 76a, 76b, etc., that temporarily receive, store, and transmit data transfer commands. In embodiments with more than one AV data buffer, each AV data buffer 72a, 72b, etc., is used in conjunction with a separate sequence of streaming AV data segments 14 corresponding to a separate video data stream. In embodiments with more than one IT data buffer, each IT data buffer 75a, 75b, etc., is used in conjunction with a separate set of IT data segments 12. Each command buffer 76a, 76b, etc., is used in conjunction with a separate set of data transfer commands corresponding to either transferring a separate sequence of streaming AV data segments 14 or transferring a separate set of IT data segments 12.

The data management system 70 further comprises a host processor 80 that generates a sequence of data transfer commands sent to the disk drive 60 to transfer a respective sequence of streaming AV data segments 14 at the required data transfer rate.

The host processor 80 also selectively interposes a first data transfer command into the sequence of data transfer commands, the first data transfer command initiating a first transfer of an IT data segment 12. The host processor 80 also receives a data transfer error signal generated by the disk drive 60, the data transfer error signal having a state that indicates whether any data transfer errors have occurred in the first transfer of the IT data segment 12. The host processor 80 also selectively initiates host-processor-resident error recovery in response to the state of the data transfer error signal to achieve an accuracy required for the IT data segment 12 while maintaining the required data transfer rate of the sequence of streaming AV data segments 14.

By receiving user input 22, the user interface 20 permits the user to indicate to the video recording system 10 which video program segments are selected for recording from the external video data stream 32, as well as to control various other operation parameters of the video recording system 10, such as playback commands (e.g., pause, instant-replay, etc.). The user interface 20 can comprise a remote control keypad device, or a keypad wired directly to the video recording system 10. In response to the user input 22, the user interface 20 generates IT data segments 12 which are transmitted to the data management system 70. Persons skilled in the art are able to select an appropriate communication technology for the user interface 20 in accordance with the present invention.

In one embodiment of the present invention, the video input interface 30 receives an external video data stream 32 from a multiple-service operator ("MSO"). MSOs are video data service providers that supply video programming to multiple users. Examples of MSOs include, but are not limited to, cable television systems and satellite systems. Alternatively, the external video data stream 32 can be received from UHF or VHF broadcast signals using an antenna.

The video input interface 30 is configured to respond to the external video data stream 32 by generating streaming AV data segments 14 with a format which is compatible with the data management system 70 and other components of the video recording system 10. For example, to provide compatibility of the video recording system 10 with an analog-formatted external video data stream 32, the video input interface 30 of one embodiment comprises an MPEG (Motion Pictures Experts Group) encoder, which generates compressed digitally-formatted streaming AV data segments 14 in response to the analog-formatted external video data stream 32, and communicates the compressed digitally-formatted streaming AV data segments 14 to the data management system 70. Furthermore, for particular embodiments that are compatible with an encrypted external video data stream 32 (e.g., video data streams from premium cable channels), the video input interface 30 comprises a decrypter. Alternatively, in other embodiments of the present invention, the encoding and decrypting features described above may instead be performed by the data management system 70, or by some other device upstream of the video recording system 10. Persons skilled in the art are able to provide a video input interface 30 that receives and appropriately responds to the external video data stream 32 by generating streaming AV data segments 14 in a manner in accordance with the present invention.

In the preferred embodiment of the present invention, the electronic program guide ("EPG") interface 40 receives the EPG information 42 and in response generates IT data segments 12 that are transmitted to the data management system 70. In the embodiment illustrated in FIG. 1, the EPG information 42 is a database containing information regarding the broadcast schedules for various video program segments from various broadcast channels. This information is typically expressed in the form of a program grid with columns denoting the time periods, and with separate rows for each of the available broadcast channels. In one embodiment, the EPG information 42 is generated by a separate source from that of the external video data stream 32, and the EPG interface 40 is a separate interface (e.g., a phone line connection interface) from the video input interface 30. Alternatively, in other embodiments of the present invention where the EPG information 42 is generated by the same source as that of the external video data stream 32 and transmitted along with the external video data stream 32, the EPG interface 40 is part of the video input interface 30. Typically, in order to enable a user to utilize the EPG information 42, the video recording system 10 displays the program grid directly on the display device 52 being viewed by the user. The user may then provide appropriate user input 22 to the data management system 70 via the user interface 20. The data management system 70 then uses the EPG information 42 to select the external video data stream 32 for the video program segment in response to the user input 22. Persons skilled in the art are able to select an appropriate configuration of the EPG interface 40 and to select the method of communicating the EPG information 42 to both the user and the data management system 70 compatible with the present invention.

The video output interface 50 is coupled to the data management system 70 and receives IT data segments 12 and streaming AV data segments 14. The video output interface 50 is also coupled to a display device 52, which in the preferred embodiment of the present invention is a television. In response to the received data segments, the video output interface 50 generates a video data stream that is compatible with the display device 52. Alternatively, the video output interface 50 can receive video data streams directly from the data management system 70. Persons skilled in the art are able to select an appropriate configuration of the video output interface 50 compatible with the present invention.

The disk drive 60 is coupled to the data management system 70 and provides storage for both IT data segments 12 and streaming AV data segments 14. In the preferred embodiment of the present invention, the disk drive 60 is compatible with a version of the ATA standard, such as IDE (Integrated Drive Electronics). In other embodiments, the disk drive 60 is compatible with the SCSI (Small Computer System Interface) standard. In still other embodiments, the disk drive 60 is compatible with the IEEE 1394 standard, which is described in the "IEEE Std 1394–1995 IEEE Standard for a High Performance Serial Bus," Aug. 30, 1996, which is incorporated by reference herein. Alternatively, the disk drive 60 can be a writable digital video disk (DVD) drive, or another technology that provides writable non-volatile storage.

In embodiments in which the disk drive 60 is an IDE disk drive, the host processor 80 maintains a directory of the physical locations of the various data segments stored on the disk drive 60. Typically, this information is in the form of a file allocation table that contains a list of file names and the linked clusters for each file name. The file allocation table can also indicate whether each file name signifies either IT data segments 12 or streaming AV data segments 14. In other embodiments, the host processor 80 instead maintains a directory of logical locations that the disk drive 60 translates into physical locations.

The disk drive 60 of the preferred embodiment is responsive to the "Streamweaver" set of data transfer commands which incorporates additional data transfer commands beyond those found in the standard ATA data transfer command set. These additional data transfer commands are designed for transferring data segments stored or to be stored on the disk drive 60 while maintaining a required data transfer rate for transferring streaming AV data segments 14.

The various parameters and functions of the disk drive 60, such as a disk-drive-resident error recovery time limit, can be toggled between an AV mode and an IT mode by the "Set AV Configuration" command generated by the host processor 80. When placed in the AV mode, as in the preferred embodiment of the present invention, the disk drive 60 is optimized for transferring streaming AV data segments 14 at a required data transfer rate. Upon receiving a "Read AV Stream" or a "Write AV Stream" command, the disk drive 60 does not perform disk-drive-resident error recovery in the event of a data transfer error. Alternatively, in other embodiments, the disk drive 60 can perform some disk-drive-resident error recovery procedures; however, the total time allotted for these procedures is limited by the disk-drive-resident error recovery time limit. Note that while the names of these additional data transfer commands in the "Streamweaver" data transfer command set refer to "AV Stream," these data transfer commands may also be invoked to transfer IT data segments 12.

Upon each transfer of a data segment, the disk drive 60 generates a data transfer error signal which is transmitted to the host processor 80. Each data transfer error signal has a plurality of states indicative of whether any data transfer errors have occurred or not with respect to the corresponding transfer of the data segment. In the preferred embodiment of the present invention, when a data transfer error occurs, the corresponding data transfer error signal is in a first state indicative of the data transfer error occurrence. When a data transfer error has not occurred, the corresponding data transfer error signal is in a second state indicative of no data transfer error occurrence. In other embodiments, the state of the data transfer error signal can also indicate other aspects of the transfer error, such as the type of data transfer error or the portion of the data segment affected by the data transfer error.

The AV data buffer 72 of the preferred embodiment is coupled to the host processor 80 and the disk drive 60, and is used to continuously transfer streaming AV data segments 14 between the disk drive 60 and the host processor 80 or other components of the video recording system 10. Data streaming rates for continuously streaming video data (e.g., 1 Mb/s) are typically much lower than the instantaneous data transfer rates for transferring data segments from disk drives (e.g., 66 Mb/s). The AV data buffer 72 thus serves as a temporary repository of streaming AV data segments 14 in order to maintain a data streaming rate that is lower than the instantaneous data transfer rate.

Figure 2A:
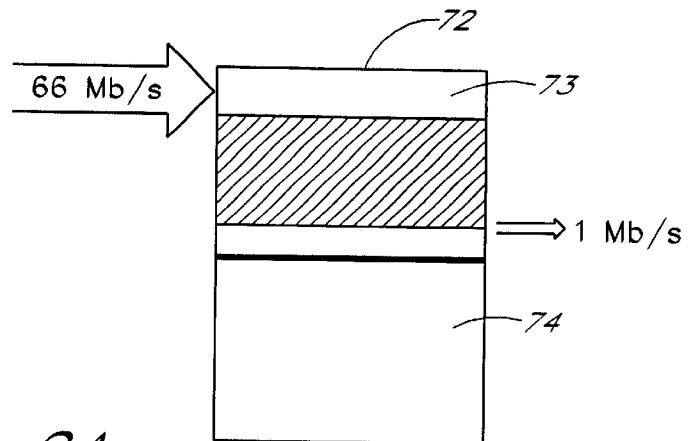
FIGS. 2a–2e schematically illustrate the AV data buffer and its first and second buffer sections at various stages during the streaming of AV data segments.

FIGS. 2a–2e provide an illustrative example of an AV data buffer 72 compatible with the present invention, in which the AV data buffer 72 is used to generate a video data stream originating from a sequence of streaming AV data segments 14 from the disk drive 60. The hatched regions denote portions of the AV data buffer 72 which contain AV data segments 14. The AV data buffer 72 is a "ping-pong" buffer which comprises first and second buffer sections 73, 74, each with a capacity of 300 Kb. At an instantaneous data transfer rate of 66 Mb/s, 100 Kb of data segments can be transferred or "burst" into the AV data buffer 72 from the disk drive 60 in approximately 1.5 ms, thereby taking approximately 4.5 ms to fill each 300 Kb buffer section. FIG. 2a illustrates the AV data buffer 72 after two bursts of data segments into the first buffer section 73. The AV data buffer 72 is prepared to receive a third burst of data segments, and some of the previously-stored data segments have been streamed out of the first buffer section 73 at the data streaming rate of 1 Mb/s.

Figure 2B:
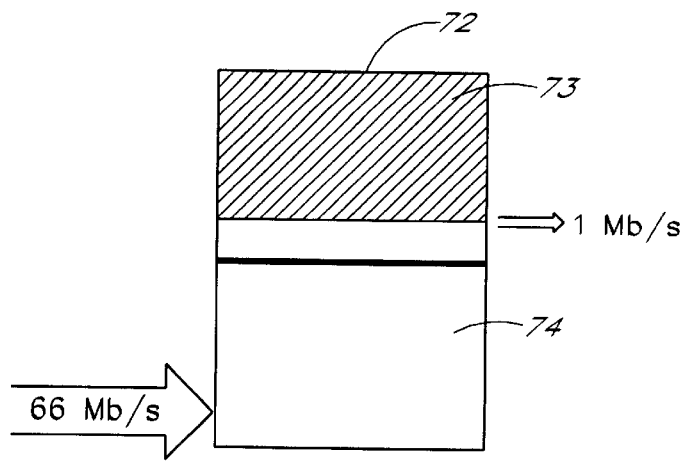
Figure 2C:
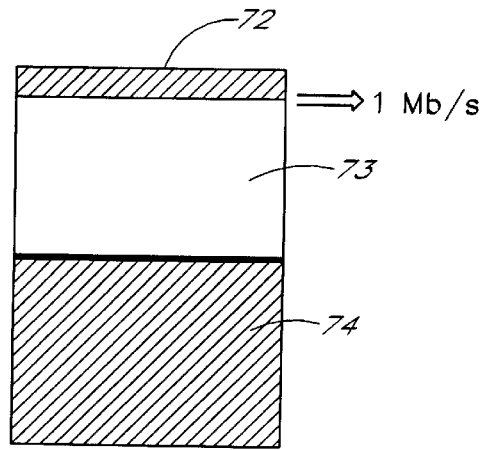

At a data streaming rate of 1 Mb/s, it takes 300 ms to completely empty the first buffer section 73. During this 300 ms, the second buffer section 74 is similarly filled in approximately 4.5 ms. FIG. 2b illustrates the AV data buffer 72 prepared to receive bursts of AV data segments 14 in the second buffer section 74 after the first buffer section 73 has been filled. FIG. 2c illustrates the AV data buffer 72 after the second buffer section 74 is completely filled and the first buffer section 73 continues to provide streaming AV data segments 14 at 1 Mb/s.

Figure 2D:
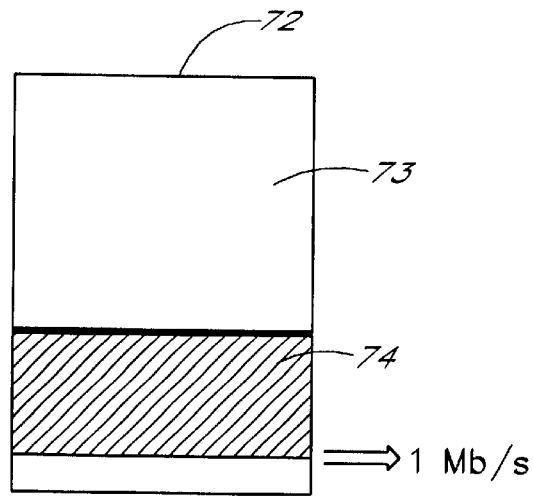
Figure 2E:
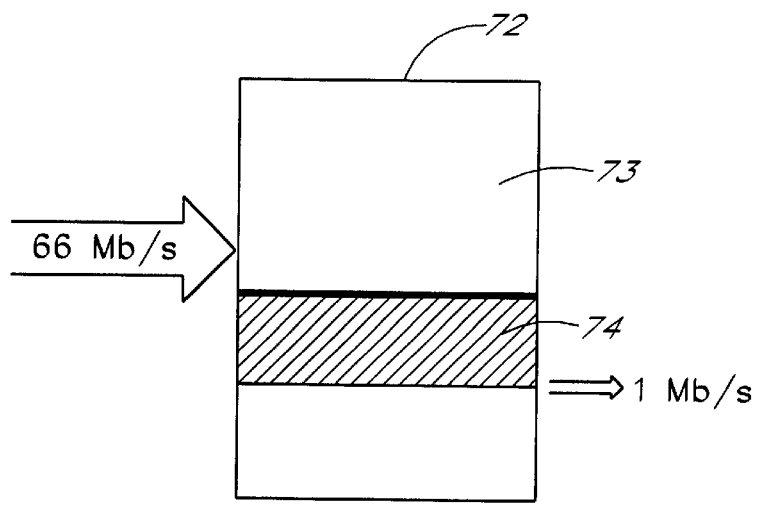

Upon completely emptying the first buffer section 73, data segments are streamed out of the second buffer section 74 at the same data streaming rate of 1 Mb/s, as illustrated in FIG. 2d. As illustrated in FIG. 2e, before the second buffer section 74 is completely emptied, the AV data buffer 72 is again prepared to receive bursts of AV data segments 14 in the first buffer section 73. After the second buffer section 74 is completely emptied, data segments are once again streamed out of the first buffer section 73, as illustrated in FIG. 2a. This "ping-pong"-like switching between the first and second buffer sections 73, 74 enables the AV data buffer 72 to generate a video data stream that originates from a sequence of streaming AV data segments 14 from the disk drive 60. Note that the intermittent bursting of data segments into the AV data buffer 72 at the instantaneous data transfer rate yields an average data transfer rate, or required data transfer rate, which equals the data streaming rate.

Data transfer commands 82 for AV data segments (discussed below in reference to FIGS. 3a, 4, and 6) are data transfer commands which initiate the transfer of AV data segments 14 into the AV data buffer 72. Similarly, data transfer commands 84 for IT data segments (discussed below in reference to FIGS. 3a, 3b, 4, 5 and 6) are data transfer commands which initiate the transfer of IT data segments 12 into the IT data buffer 75. The data transfer commands 82 for AV data segments are not carried out at any particular moment during the streaming of the AV data segments 14. However, to avoid interrupting the streaming video data due to completely emptying or overfilling the AV data buffer 72, a sequence of data transfer commands 82 for AV data segments generated by the host processor 80 is sent to the disk drive 60 to transfer a respective sequence of streaming AV data segments 14 at a required data transfer rate which equals the data streaming rate. By maintaining the required data transfer rate, each buffer section 73, 74 of the AV data buffer 72 receives streaming AV data segments 14 from the disk drive 60 before completely emptying. In addition, by maintaining the required data transfer rate, the AV data buffer 72 transmits streaming AV data segments 14 to the disk drive 60 before either buffer section 73, 74 of the AV data buffer 72 is completely filled. In this way, the preferred embodiment of the present invention, avoids the interruption of video data streams due to an empty AV data buffer 72, and avoids the loss of AV data segments due to an overfilled AV data buffer 72.

In other embodiments with multiple AV data buffers 72a, 72b, etc., a second AV data buffer can be used to concurrently store a second video data stream onto the disk drive 60 by continually receiving streaming video data, and intermittently transferring the corresponding data segments to the disk drive 60. Persons skilled in the art recognize that other configurations of the AV data buffer 72 is compatible with the present invention.

The IT data buffer 75 of the preferred embodiment temporarily stores IT data segments 12 to be used by the host processor 80. These IT data segments 12 can be received from the user interface 20, EPG interface 40, or disk drive 60. In addition, the IT data segments 12 can be generated by the host processor 80 in response to other data segments. Persons skilled in the art can provide an appropriate configuration of the IT data buffer 75 compatible with the present invention.

Figure 3A:
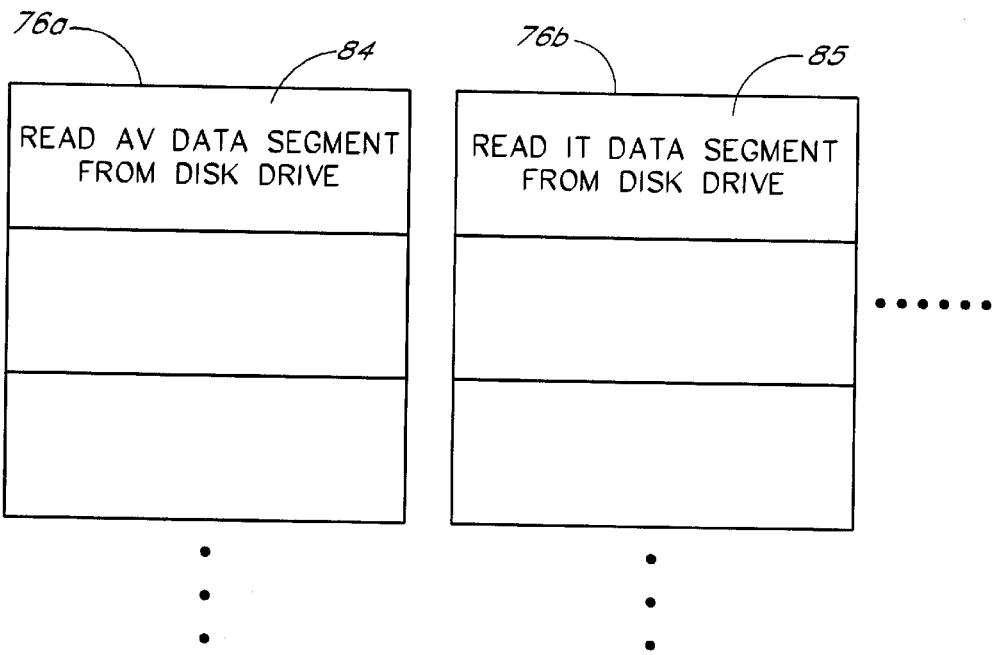
FIG. 3a schematically illustrates two command buffers of the data management system with one data transfer command for AV data segments and one data transfer command for IT data segments.
Figure 3B:
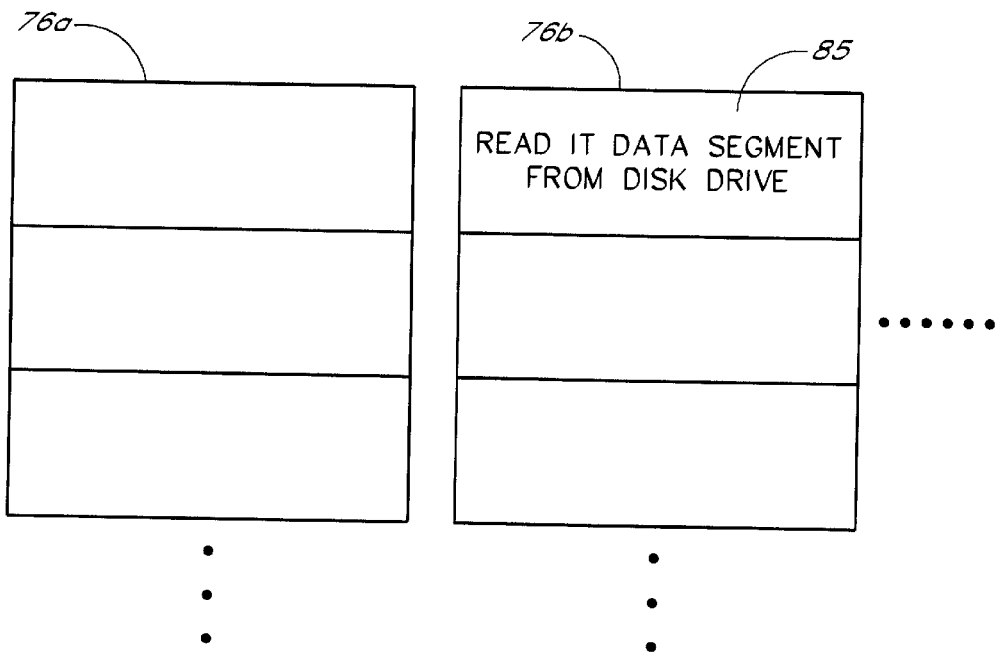
FIG. 3b schematically illustrates two command buffers of the data management system with one data transfer command for IT data segments.

The command buffers 76a, 76b, etc., serve as temporary repositories of data transfer commands generated by the host processor 80 before they are issued to the disk drive 60. Each command buffer 76a, 76b, etc., is used either for data transfer commands 84 for transferring IT data segments or for data transfer commands 82 for transferring AV data segments. In an alternative embodiment, only one command buffer 76 can be used for data transfer commands for either type of data segment. As illustrated in FIGS. 3a and 3b, each command buffer 76a, 76b, etc., can store multiple data transfer commands concurrently. In other embodiments, each command buffer 76a, 76b, etc., can store only one data transfer command at one time.

In the preferred embodiment of the present invention, the host processor 80 is a microprocessor that contains the operating system of the data management system 70. The host processor 80 also performs various functions in response to IT data segments 12 and streaming AV data segments 14 generated by other components of the video recording system 10. Data transfer commands are selectively generated by the host processor 80, temporarily stored in the command buffers 76a, 76b, etc., and selectively transmitted to the disk drive 60. IT data segments 12 are selectively routed by the host processor 80 to the IT data buffer 75 and the disk drive 60. In addition, the host processor 80 can generate IT data segments 12 in response to other data segments it receives. Streaming AV data segments 14 received from the video input interface 30 and the disk drive 60 are temporarily stored in the AV data buffer 72 and selectively transmitted to the disk drive 60 and the video output interface 50.

Data transfer commands are selectively generated by the host processor 80 and temporarily stored in command buffers 76a, 76b, etc., in response to the data requirements of the data management system 70 based on user input 22, EPG information 42, status of the AV data buffer 72 and IT data buffer 75, and various other system parameters. These data transfer commands can be either data transfer commands 82 for AV data segments or data transfer commands 84 for IT data segments. In the preferred embodiment of the present invention, both data transfer commands 82 for AV data segments and data transfer commands 84 for IT data segments are either "Read AV Stream" or "Write AV Stream" commands, which do not perform any disk-drive-resident error recovery. For example, the user can select to view on the display device 52 a continuous stream of video data based on data segments previously stored on the disk drive 60. Similarly, the user may request that an incoming stream of video data be stored onto the disk drive 60. In both of these circumstances, the host processor 80 generates a sequence of data transfer commands 82 for AV data segments corresponding to a respective sequence of streaming AV data segments 14. Each of these data transfer commands 82 for AV data segments is temporarily stored in the appropriate command buffer 76a. FIG. 3a schematically illustrates a command buffer 76a containing a data transfer command 82 for AV data segments to read such a streaming AV data segment 14 from the disk drive 60.

In addition, concurrent with the transferring of the streaming AV data segments 14, the data management system 70 is typically requested to also transfer IT data segments 12. For example, EPG information 42 may be stored on, or retrieved from, the disk drive 60 during the continuous streaming of video data corresponding to the sequence of streaming AV data segments 14. Under these circumstances, the host processor 80 generates a first data transfer command 84 for IT data segments and temporarily stores the first data transfer command 84 for IT data segments in the appropriate command buffer 76b. When it is eventually sent to the disk drive 60, the first data transfer command 84 for IT data segments initiates a first transfer of a requested IT data segment 12. FIGS. 3a and 3b schematically illustrate a command buffer 76b containing a first data transfer command 84 for IT data segments to read such a requested IT data segment 12 from the disk drive 60.

Figure 4:
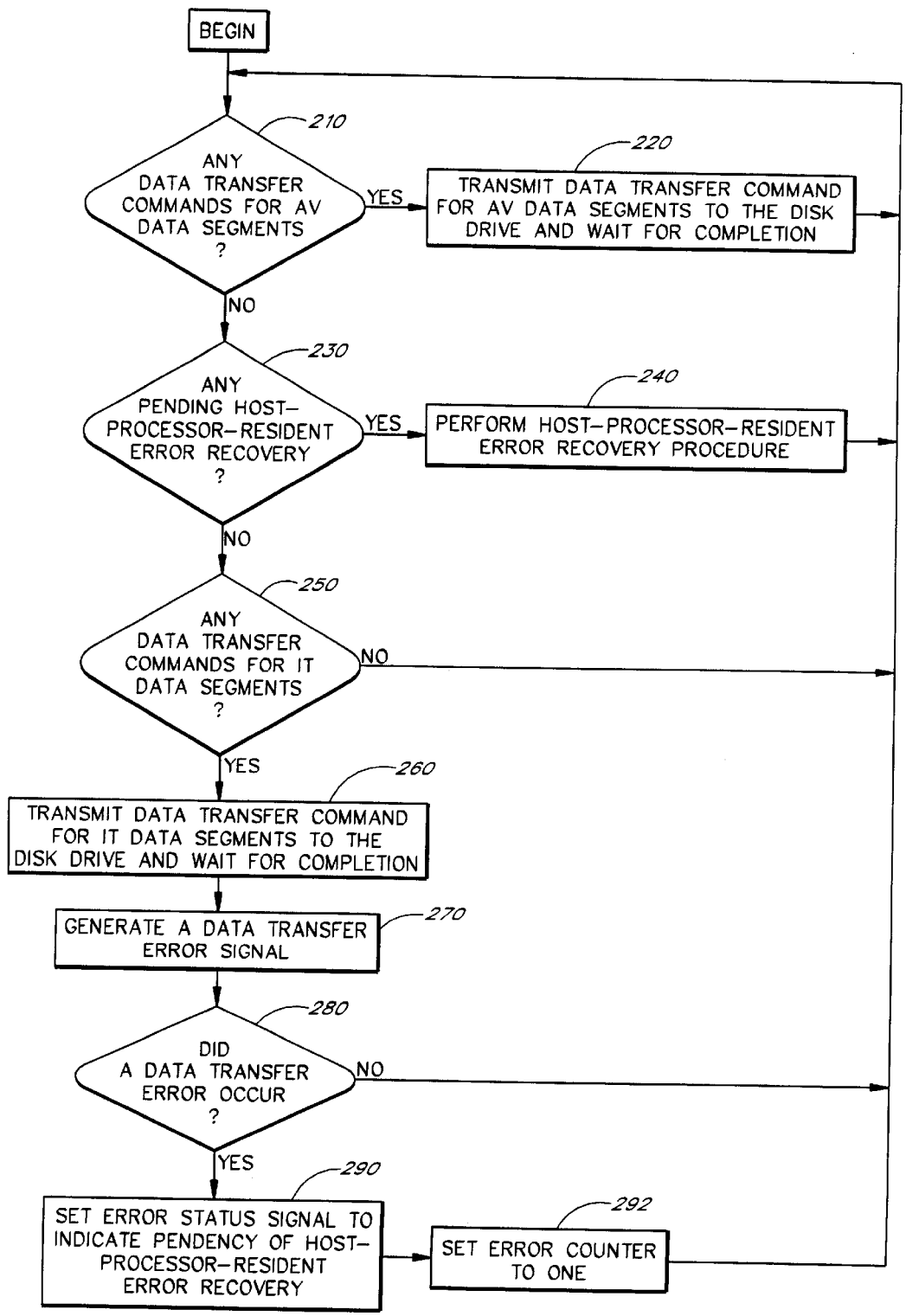
FIG. 4 is a flowchart that schematically illustrates a method of transferring an IT data segment stored or to be stored on the disk drive while transferring a sequence of AV data segments at a required data transfer rate, the method achieving an accuracy required for the IT data segment while maintaining the required data transfer rate of the sequence of AV data segments.

FIG. 4 is a flowchart which illustrates the preferred embodiment of the present invention of a method 200 of transferring an IT data segment 12 stored or to be stored on the disk drive 60. As described above, the disk drive 60 utilized by the method 200 is responsive to a set of data transfer commands from the host processor 80, and the disk drive 60 is operating in a mode optimized for transferring streaming AV data segments 14 stored or to be stored on the disk drive 60. The method 200 illustrated in FIG. 4 achieves an accuracy required for the IT data segment 12 while maintaining the required data transfer rate of a sequence of streaming AV data segments 14. The following discussion is made in reference to the data transfer commands illustrated in FIGS. 3a and 3b for reading the IT data segment 12 and for reading a sequence of streaming AV data segments 14 from the disk drive 60. However, persons skilled in the art are able to recognize that the preferred embodiment of the present invention is also compatible with the writing of an IT data segment 12 or the writing of a sequence of streaming AV data segments 14 to the disk drive 60.

As described above, the transfer of the sequence of streaming AV data segments 14 has priority over the transfer of the IT data segment 12 in order to maintain the required data transfer rate for the sequence of streaming AV data segments 14. This required data transfer rate is maintained by selectively interposing a first data transfer command 84 for IT data segments into the sequence of data transfer commands 82 for AV data segments. As shown in FIG. 4, in a decision block 210, the data management system 70 first evaluates whether there is a data transfer command 82 for AV data segments in the command buffer 76a. If there is such a data transfer command 82 for AV data segments, as there is in FIG. 3a, then in a procedure block 220, the data management system 70 transmits the data transfer command 82 for AV data segments to the disk drive 60, which responds by reading the requested streaming AV data segment 14. After waiting for the completion of the data transfer command 82 for AV data segments, the data management system 70 then again evaluates, in a decision block 210, whether there is a data transfer command 82 for AV data segments in the command buffer 76a.

If there is no such data transfer command 82 for AV data segments in the command buffer 76a, as illustrated in FIG. 3b, then the data management system 70 evaluates, in a decision block 230, whether there is a pending host-processor-resident error recovery corresponding to a previously-performed data transfer command 84 for IT data segments. As described below, a host-processor-resident error recovery is pending after a data transfer error occurs with respect to the transfer of an IT data segment 12. The pendancy of a host-processor-resident error recovery with respect to an IT data segment 12 is indicated in the preferred embodiment by an error status signal of the data management system 70; however, other embodiments can use alternative indications.

If the error status signal indicates that there is a pending host-processor-resident error recovery corresponding to a previously-performed data transfer command 84 for IT data segments, then the data management system 70 continues the pending host-processor-resident error recovery by performing a host-processor-resident error recovery procedure 240. As will be described below, host-processor-resident error recovery can comprise various procedures initiated by the host processor in an attempt to re-transfer the requested IT data segment 12 without a data transfer error. However, the host-processor-resident error recovery procedure only takes a limited amount of time to perform in order to not delay any subsequent data transfer commands 82 for AV data segments. After waiting for the completion of the host-processor-resident error recovery procedure 240, the data management system 70 then again evaluates, in a decision block 210, whether there is a data transfer command 82 for AV data segments in the command buffer 76a.

If host-processor-resident error recovery for an IT data segment 12 is not pending, then the data management system 70 evaluates, in a decision block 250, whether there is a first data transfer command 84 for IT data segments for initiating a first transfer of an IT data segment 12 in the command buffer 76b. If there is no such first data transfer command 84 for IT data segments, then the data management system 70 again evaluates, in a decision block 210, whether there is a data transfer command 82 for AV data segments in the command buffer 76a.

If the command buffer 76b does contain a first data transfer command 84 for IT data segments for initiating a transfer of an IT data segment 12, as illustrated in FIG. 3b, then in a procedure block 260, the data management system 70 transmits the first data transfer command 84 for IT data segments to the disk drive 60, which responds by reading the requested IT data segment 12. Upon completion of the first data transfer command 84 for IT data segments, the disk drive 60 generates, in a procedure block 270, a data transfer error signal which is transmitted to the host processor 80. As described above, the data transfer error signal of the preferred embodiment has a first state that indicates a data transfer error has occurred with respect to the first transfer of the IT data segment 12, or a second state that indicates that no data transfer error has occurred with respect to the first transfer of the IT data segment 12.

The host processor 80 then evaluates, in a decision block 280, the state of the data transfer error signal to determine whether a data transfer error has occurred with respect to the first transfer of the IT data segment 12. If the data transfer error signal is in the second state, then the IT data segment 12 was successfully read with no data transfer error, and the data management system 70 again evaluates, in a decision block 210, whether there is a data transfer command 82 for AV data segments in the command buffer 76a. If the data transfer error signal is in the first state, then a data transfer error occurred with respect to the transfer of the IT data segment 12 and the error status signal of the data management system 70 is set, in a procedure block 290, to indicate the pendancy of a host-processor-resident error recovery with respect to the IT data segment 12. Also, an error counter is set, in a procedure block 292, to indicate one data transfer error with respect to the IT data segment 12. The data management system 70 then again evaluates, in a decision block 210, whether there is a data transfer command 82 for AV data segments in the command buffer 76a.

Figure 5:
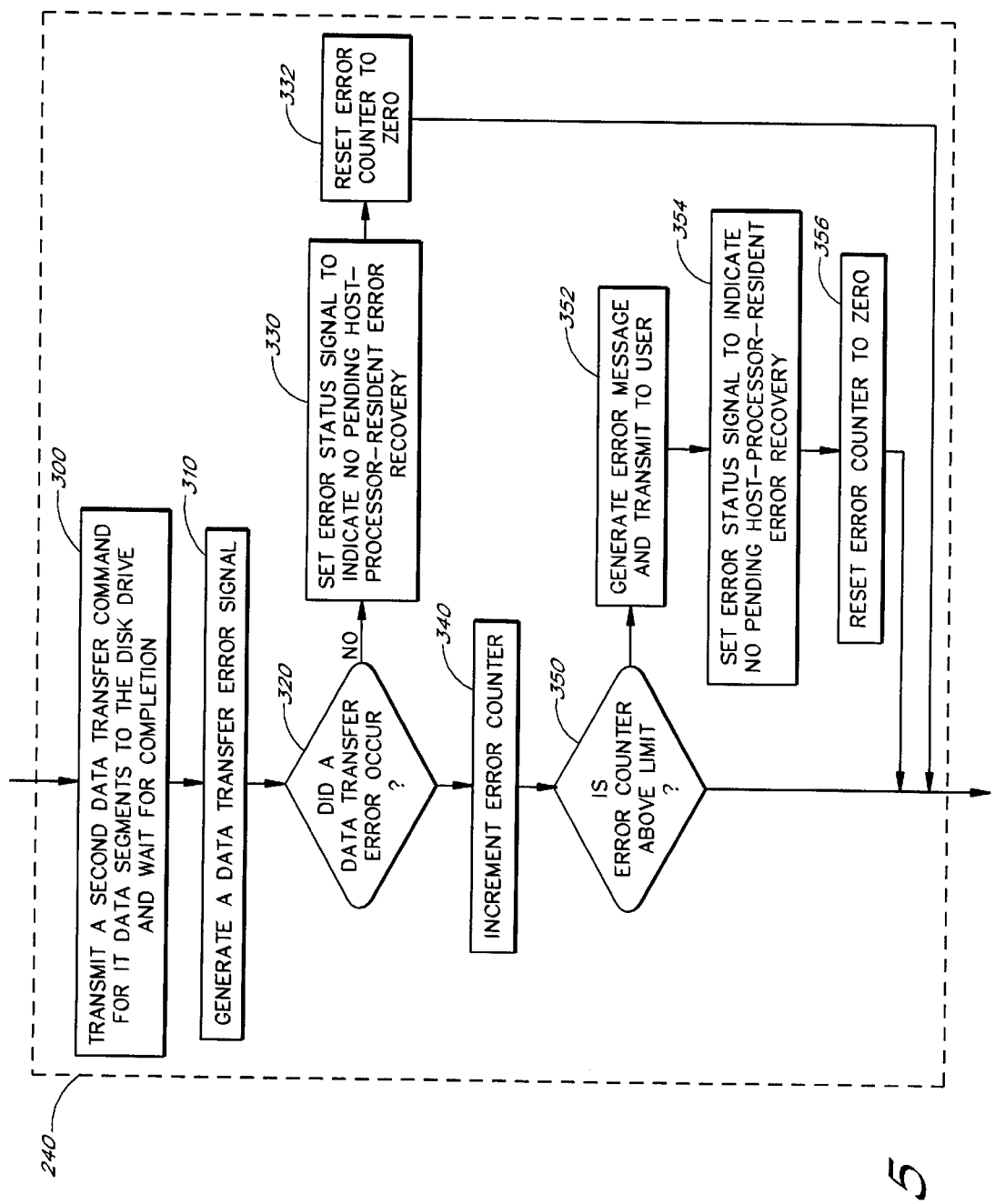
FIG. 5 is a flowchart that schematically illustrates one embodiment of a host-processor-resident error recovery procedure that is compatible with the present invention.

In the preferred embodiment of the present invention, when performing the procedure 240, the host-processor-resident error recovery comprises re-trying the transfer of the requested IT data segment 12 to read the requested IT data segment 12 from the disk drive 60 without a data transfer error. As illustrated in FIG. 5, when the error status signal indicates a pending host-processor-resident error recovery in relation to the IT data segment 12, the host processor 80 transmits, in a procedure block 300, a second data transfer command 84' for IT data segments (discussed below in relation to FIG. 6c) that initiates a second transfer of the IT data segment 12. In the preferred embodiment, this second transfer of the IT data segment 12 is made in relation to the same location on the disk drive 60 as for the first data transfer command 84 for IT data segments.

Upon completion of the second data transfer command 84' for IT data segments, the disk drive 60 generates, in a procedure block 310, a data transfer error signal which is transmitted to the host processor 80. The host processor 80 then evaluates, in a decision block 320, the state of the data transfer error signal to determine whether a data transfer error has occurred with respect to the second transfer of the IT data segment 12.

If the data transfer error signal is in the second state, then the IT data segment 12 was successfully read with no data transfer error, and the data management system 70 sets, in a procedure block 330, the error status signal to indicate that there is no pending host-processor-resident error recovery with respect to the IT data segment 12. After resetting the error counter to zero in a procedure block 332, the data management system 70 again evaluates, in a decision block 210, whether there is a data transfer command 82 for AV data segments in the command buffer 76*a*.

If the data transfer error signal is in the first state, then a data transfer error occurred again with respect to the transfer of the IT data segment 12 and the error counter is incremented by one in a procedure block 340, and the data management system 70 evaluates, in a decision block 350, whether the number of re-tries of the transfer of the IT data segment 12 is above a pre-determined limit. If the error counter indicates a number of errors below the pre-determined limit, then the data management system 70 again evaluates, in a decision block 210, whether there is a data transfer command 82 for AV data segments in the command buffer 76*a*.

If the error counter indicates a number of errors above the pre-determined limit, then the host-processor-resident error recovery corresponding to the IT data segment 12 has totally failed and the data management system 70 responds appropriately. In the preferred embodiment, this appropriate response comprises generating an error message, in a procedure block 352, which is transmitted to the user, setting the error status signal, in a procedure block 354, to indicate no pending host-processor-resident error recovery with respect to the IT data segment 12, and resetting the error counter to zero in a procedure block 356. The data management system 70 then again evaluates, in a decision block 210, whether there is a data transfer command 82 for AV data segments in the command buffer 76*a*. Other embodiments may respond differently to the total failure of the host-processor-resident error recovery, including the utilization of alternative error recovery procedures.

Figure 6A:
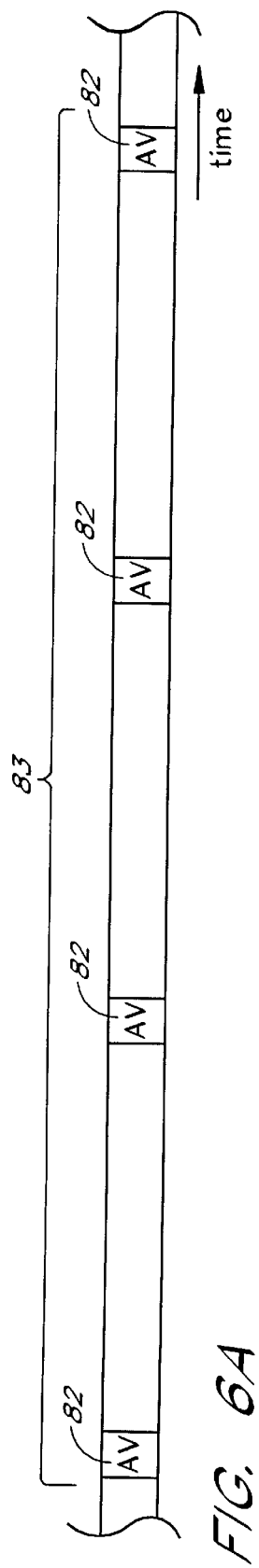
FIGS. 6a–6c schematically illustrate various sequences of data transfer commands for transferring both AV data segments and IT data segments, the sequences being compatible with the present invention.
Figure 6B:
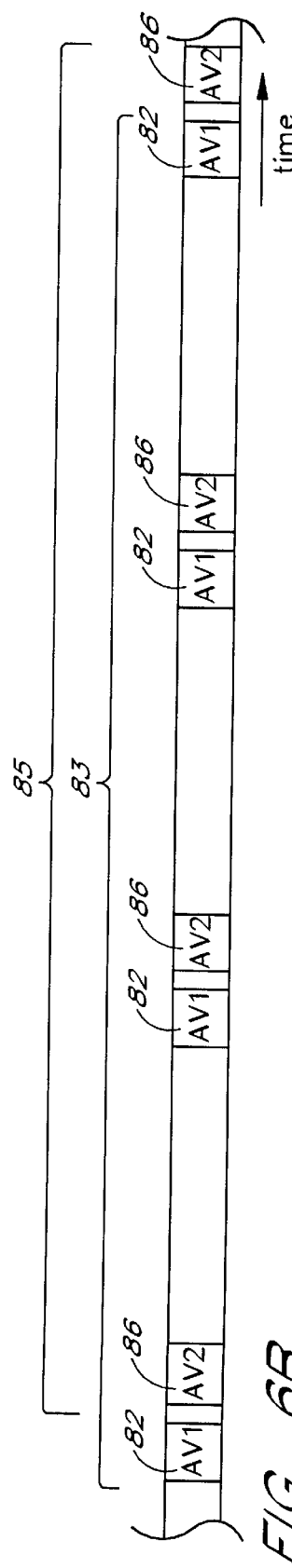

As described above, the preferred embodiment of the present invention transmits, in a procedure block 220, any data transfer commands 82 for AV data segments before transmitting, in a procedure block 250, any data transfer commands 84 for IT data segments. In this way, the preferred embodiment sends a sequence of data transfer commands generated by the host processor to the disk drive to transfer a respective sequence of streaming AV data segments 14 at a required data transfer rate. Where there are no data transfer commands 84 for IT data segments in the command buffer 76*b*, this sequence 83 of data transfer commands 82 for AV data segments is illustrated in FIG. 6*a*. Similarly, as illustrated in FIG. 6*b*, certain embodiments maintain multiple sequences 83, 85 of data transfer commands 82, 86 for AV data segments to transfer respective sequences of streaming AV data segments 14 at the required data transfer rate. In such circumstances, the data transfer bandwidth of the first stream of AV data segments 14, transferred by the first sequence 83 of data transfer commands 82 for AV data segments ("AV1") is less than the maximum bandwidth for the disk drive 60. The multiple sequences 83, 85 correspond to multiple video data streams, either read from or written to the disk drive 60. As illustrated in FIG. 6*b*, the streaming of the second stream of AV data segments 14, transferred by the second sequence 85 of data transfer commands 86 for AV data segments ("AV2"), occurs within a remaining bandwidth that is a difference between the maximum bandwidth and the data transfer bandwidth for the first stream of AV data segments 14.

Figure 6C:
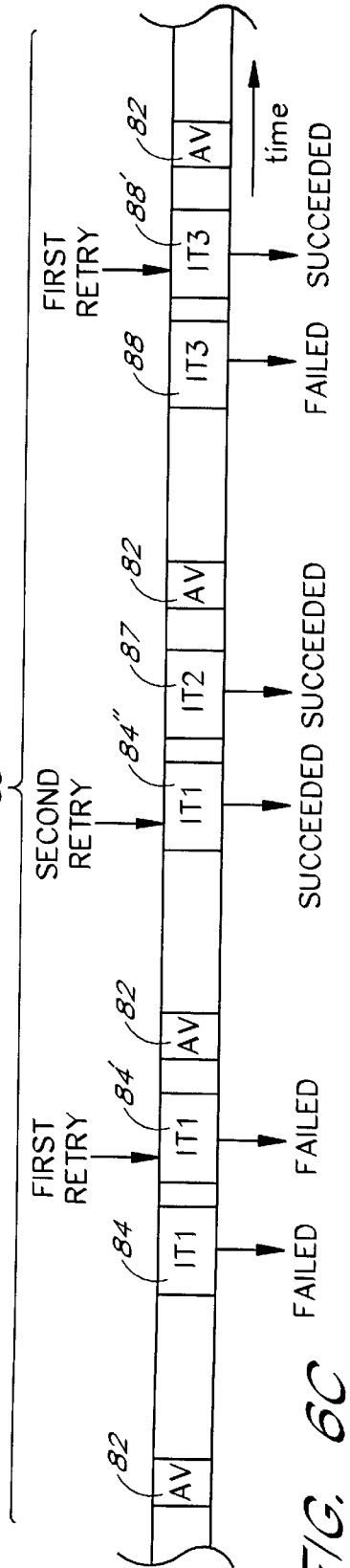

As illustrated in FIG. 6*c*, the preferred embodiment also selectively interposes a first data transfer command 84 for IT data segments into the sequence 83 of data transfer commands 82 for AV data segments by transmitting, in the procedure block 260, the first data transfer command 84 for IT data segments to the disk drive 60 only when there are no data transfer commands 82 for AV data segments in the command buffer 76*a*. In FIG. 6*c*, the first transfer of the IT1 data segment 12 results in a data transfer error, as indicated by the data transfer error signal generated by the disk drive 60 in the procedure block 270. By evaluating the data transfer error signal, the host processor 80 is able to selectively initiate host-processor-resident error recovery. In the preferred embodiment of the present invention, the host-processor-resident error recovery comprises transmitting a second data transfer command 84' for IT data segments for the same IT1 data segment 12 to the disk drive 60 in the procedure block 300, which in FIG. 6*c* also results in a data transfer error. However, because a data transfer command 82 for AV data segments is found by the data management system 70 in the AV data buffer 72, the third data transfer command 84" for IT data segments, corresponding to a second retry of transferring the IT1 data segment 12, is delayed until after the data transfer command 82 for AV data segments is completed. In FIG. 6*c*, this second retry of the transfer of the IT1 data segment is successful. In this way, the data management system 70 selectively initiates host-processor-resident error recovery in response to the state of the data transfer error signal to achieve an accuracy required for the IT data segments 12 while maintaining the required data transfer rate for the sequence of streaming AV data segments 14. As illustrated in FIG. 6*c*, the process continues to provide transfer of other IT data segments IT2 (using a data transfer command 87 for IT data segments which succeeds on the first attempt), and IT3 (using a data transfer command 88 for IT data segments which fails, and a first retry utilizing a data transfer command 88' for IT data segments which succeeds).

What is claimed is:

1. A method of transferring a non-time-critical, error-intolerant data segment stored or to be stored on a disk drive, which is responsive to a set of data transfer commands generated by a host processor and which is operating in a mode optimized for transferring time-critical, error-tolerant streaming data segments stored or to be stored on the disk drive, the method comprising:

sending a sequence of data transfer commands generated by the host processor to the disk drive to transfer a respective sequence of time-critical, error-tolerant streaming data segments at a required data transfer rate;

selectively interposing a first data transfer command into the sequence of data transfer commands, the first data transfer command initiating a first transfer of the non-time-critical, error-intolerant data segment;

transmitting a data transfer error signal generated by the disk drive to the host processor, the data transfer error signal having a state that indicates whether any data transfer errors have occurred with respect to the first transfer of the non-time-critical, error-intolerant data segment; and selectively initiating host-processor-resident error recovery in response to the state of the data transfer error signal to achieve an accuracy required for the non-time-critical, error-intolerant data segment while maintaining the required data transfer rate of the sequence of time-critical, error-tolerant streaming data segments.

2. The method of claim 1, wherein the host-processor-resident error recovery comprises interposing a second data transfer command into the sequence of data transfer commands, the second data transfer command initiating a second transfer of the non-time-critical, error-intolerant data segment.

3. The method of claim 2, wherein the first transfer of the non-time-critical, error-intolerant data segment and second transfer of the non-time-critical, error-intolerant data segment are made in relation to the same location on the disk.

4. The method of claim 1, wherein the required data transfer rate is less than a maximum data transfer rate for the disk drive, thereby providing time for transferring the non-time-critical, error-intolerant data segment while maintaining the required data transfer rate for transferring the sequence of time-critical, error-tolerant streaming data segments.

5. The method of claim 1, wherein the time-critical, error-tolerant streaming data segments correspond to audio/visual data.

6. The method of claim 1, wherein the set of data transfer commands requires no disk-drive-resident error recovery in the event of a data transfer error.

7. The method of claim 1, wherein the disk drive is compatible with one or more standard from the group: IDE, ATA, SCSI, IEEE 1394.

8. The method of claim 1, wherein the first data transfer command is a first read data command that initiates the transfer of a data segment stored on the disk drive.

9. The method of claim 1, wherein the first data transfer command is a first write data command that initiates the transfer of a data segment to be stored on the disk drive.

10. A method of transferring a non-time-critical, error-intolerant data segment stored or to be stored on a disk drive, which is responsive to a set of data transfer commands generated by a host processor and which is operating in a mode optimized for transferring time-critical, error-tolerant streaming data segments stored or to be stored on the disk drive, the method comprising:

sending a sequence of data transfer commands generated by the host processor to the disk drive to transfer a respective sequence of time-critical, error-tolerant streaming data segments within a data transfer bandwidth less than a maximum bandwidth for the disk drive;

selectively interposing a first data transfer command into the sequence of data transfer commands, the first data transfer command initiating a first transfer of the non-time-critical, error-intolerant data segment, the first transfer of the non-time-critical, error-intolerant data segment occurring within a remaining bandwidth that is a difference between the maximum bandwidth and the data transfer bandwidth;

transmitting a data transfer error signal generated by the disk drive to the host processor, the data transfer error signal having a state that indicates whether any data transfer errors have occurred with respect to the first transfer of the non-time-critical, error-intolerant data segment; and selectively initiating host-processor-resident error recovery in response to the state of the data transfer error signal to achieve an accuracy required for the non-time-critical, error-intolerant data segment while maintaining the data transfer bandwidth for the sequence of time-critical, error-tolerant streaming data segments.

11. The method of claim 10, wherein the host-processor-resident error recovery comprises interposing a second data transfer command into the sequence of data transfer commands, the second data transfer command initiating a second transfer of the non-time-critical, error-intolerant data segment.

12. The method of claim 11, wherein the first transfer of the non-time-critical, error-intolerant data segment and second transfer of the non-time-critical, error-intolerant data segment are made in relation to the same location on the disk.

13. A video recording system to record and playback non-time-critical, error-intolerant data segments and time-critical, error-tolerant streaming data segments using a disk drive responsive to a set of data transfer commands and optimized for transferring time-critical, error-tolerant streaming data segments at a required data transfer rate, the video recording system comprising:

a user interface that receives user input;

a video input interface that receives an external video data stream for a selected video program segment and that generates time-critical, error-tolerant streaming data segments;

a video output interface that is connectable to a display device; and a data management system that comprises:
at least one data buffer that receives, stores, and transmits time-critical, error-tolerant streaming data segments; and
a host processor that generates a sequence of data transfer commands sent to the disk drive to transfer a respective sequence of time-critical, error-tolerant streaming data segments at the required data transfer rate; that selectively interposes a first data transfer command into the sequence of data transfer commands, the first data transfer command initiating a first transfer of a non-time-critical, error-intolerant data segment; that receives a data transfer error signal generated by the disk drive, the data transfer error signal having a state that indicates whether any data transfer errors have occurred in the first transfer of the non-time-critical, error-intolerant data segment; and that selectively initiates host-processor-resident error recovery in response to the state of the data transfer error signal to achieve an accuracy required for the non-time-critical, error-intolerant data segment while maintaining the required data transfer rate of the sequence of time-critical, error-tolerant streaming data segments.

14. The video recording system of claim 13, wherein the data management system further comprises at least one data buffer that receives, stores, and transmits non-time-critical, error-intolerant data segments.

15. The video recording system of claim 13, wherein the data management system further comprises a command buffer.

* * * * *